US010297746B2

(12) United States Patent
Wang et al.

(10) Patent No.: US 10,297,746 B2
(45) Date of Patent: May 21, 2019

(54) POST TREATMENT TO REDUCE SHUNTING DEVICES FOR PHYSICAL ETCHING PROCESS

(71) Applicant: Taiwan Semiconductor Manufacturing Company, Ltd., Hsinchu (TW)

(72) Inventors: Yu-Jen Wang, San Jose, CA (US); Dongna Shen, San Jose, CA (US); Vignesh Sundar, Sunnyvale, CA (US); Sahil Patel, Fremont, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/479,514

(22) Filed: Apr. 5, 2017

(65) Prior Publication Data

US 2018/0294405 A1 Oct. 11, 2018

(51) Int. Cl.

| | |
|---|---|
| ***H01L 21/00*** | (2006.01) |
| ***H01L 27/00*** | (2006.01) |
| ***H01L 43/00*** | (2006.01) |
| ***H01L 43/12*** | (2006.01) |

(52) U.S. Cl.
CPC .................................... *H01L 43/12* (2013.01)

(58) Field of Classification Search
CPC ......... H01L 21/28291; H01L 27/11502; H01L 27/11585; H01L 27/22; H01L 29/516; H01L 2924/1441; H01L 43/00
See application file for complete search history.

(56) References Cited

U.S. PATENT DOCUMENTS

| | | | |
|---|---|---|---|
| 6,798,626 B2 | 9/2004 | Hayashi et al. | |
| 7,043,823 B2 | 5/2006 | Childress et al. | |
| 7,936,027 B2 * | 5/2011 | Xiao | H01L 43/12 257/421 |
| 8,045,299 B2 | 10/2011 | Fontana, Jr. et al. | |
| 8,673,654 B2 | 3/2014 | Hong et al. | |
| 8,981,507 B2 | 3/2015 | Takahashi et al. | |
| 8,993,352 B2 * | 3/2015 | Nishimura | H01L 43/12 156/345.29 |
| 9,257,638 B2 | 2/2016 | Tan et al. | |
| 9,472,753 B1 * | 10/2016 | Katine | H01L 43/12 |

(Continued)

FOREIGN PATENT DOCUMENTS

| | | |
|---|---|---|
| JP | 63 055956 | 3/1988 |
| WO | WO 2015/136723 | 9/2015 |

OTHER PUBLICATIONS

PCT Search Report, International Application No. PCT/US2018/021452, Applicant: Headway Technologies, Inc., dated Jul. 10, 2018, 12 pgs.

*Primary Examiner* — Sonya D. McCall-Shepard
(74) *Attorney, Agent, or Firm* — Haynes and Boone, LLP

(57) ABSTRACT

A method for etching a magnetic tunneling junction (MTJ) structure is described. A stack of MTJ layers is provided on a bottom electrode. A top electrode is provided on the MTJ stack. The top electrode is patterned. Thereafter, the MTJ stack not covered by the patterned top electrode is oxidized or nitridized. Then, the MTJ stack is patterned to form a MTJ device wherein any sidewall re-deposition formed on sidewalls of the MTJ device is non-conductive and wherein some of the dielectric layer remains on horizontal surfaces of the bottom electrode.

13 Claims, 1 Drawing Sheet

(56) References Cited

U.S. PATENT DOCUMENTS

| | | | | |
|---|---|---|---|---|
| 9,589,838 | B2 * | 3/2017 | Wang | H01L 29/0684 |
| 2003/0180968 | A1 * | 9/2003 | Nallan | H01L 23/564<br>438/3 |
| 2011/0104881 | A1 * | 5/2011 | Lee | H01L 21/28247<br>438/591 |
| 2013/0001652 | A1 | 1/2013 | Yoshikawa et al. | |
| 2013/0248355 | A1 | 9/2013 | Ohsawa et al. | |
| 2015/0311432 | A1 | 10/2015 | Nakagawa et al. | |
| 2016/0087195 | A1 * | 3/2016 | Sonoda | H01L 43/12<br>438/3 |
| 2018/0079308 | A1 | 3/2018 | Ilu | |

* cited by examiner

POST TREATMENT TO REDUCE SHUNTING DEVICES FOR PHYSICAL ETCHING PROCESS

TECHNICAL FIELD

This application relates to the general field of magnetic tunneling junctions (MTJ) and, more particularly, to etching methods for forming MTJ structures.

BACKGROUND

A typical MTJ etched by a chemical etching process is found to have sidewall damage, possibly caused by oxygen or other chemicals during the etching process. Pure physical etching processes such as ion beam etching (IBE) can minimize sidewall damage. However, one drawback of the physical etching process is the sidewall re-deposition of material from the bottom electrode and MTJ materials to the MTJ sidewalls. The sidewall re-deposition of the bottom electrode will lead to a shunting path around the MTJ sidewall and then lead to low yield for the MRAM chip.

Several patents teach methods to reduce shunting. These include U.S. Pat. No. 9,257,638 (Tan et al), U.S. Pat. No. 7,043,823 (Childress et al), U.S. Pat. No. 8,981,507 (Takahashi et al), U.S. Pat. No. 6,798,626 (Hayashi et al), U.S. Pat. No. 8,045,299 (Fontana, Jr et al), U.S. Pat. No. 8,673,654 (Hong et al) and U.S. Patent Application 2016/0079308 (Ito). U.S. Pat. No. 8,045,299 (Fontana, Jr et al—HGST) teaches etching and then oxidizing the MTJ stack or adding ozone or water to the etching process to oxidize the re-depositing material.

SUMMARY

It is an object of the present disclosure to provide an improved etching process in forming MTJ structures.

Yet another object of the present disclosure is to provide an etching process that reduces shunting of MTJ devices.

In accordance with the objectives of the present disclosure, a method for etching a magnetic tunneling junction (MTJ) structure is achieved. A stack of MTJ layers is provided on a bottom electrode. A top electrode is provided on the MTJ stack. The top electrode is patterned. Thereafter, the MTJ stack not covered by the patterned top electrode is oxidized or nitridized. Then, the MTJ stack is patterned to form a MTJ device wherein any sidewall re-deposition formed on sidewalls of the MTJ device is non-conductive.

BRIEF DESCRIPTION OF THE DRAWINGS

In the accompanying drawings forming a material part of this description, there is shown:

FIGS. 1, 2, 3B, and 4B illustrate in cross-sectional representation steps in a second preferred embodiment of the present disclosure.

DETAILED DESCRIPTION

For most pure physical etching processes (such as IBE), the sidewall always suffers a severe re-deposition issue since the by-products of the etched material are non-volatile. To prevent the re-deposition material around the MTJ sidewall from becoming a shunting path for the MTJ, we apply a surface treatment by oxygen to convert the potential re-deposition material from conductive to non-conductive. This step will ensure that any re-deposition is non-conductive and will not cause shunting of the MTJ devices.

Figure 1:
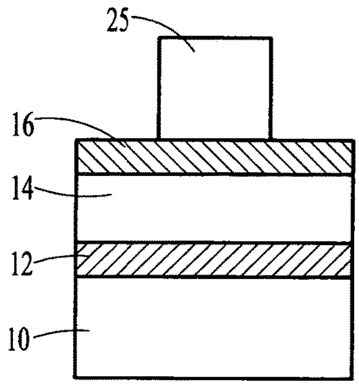
FIGS. 1, 2, 3A, and 4A illustrate in cross-sectional representation steps in a first preferred embodiment of the present disclosure.

Referring now particularly to FIGS. 1 through 4, the novel disclosure will be described in detail. A bottom electrode 12 is formed on the substrate 10, as shown in FIG. 1. Now, layers are deposited on the bottom electrode to form a magnetic tunnel junction. Layer 14 includes the MTJ layers including one or more seed layers, pinned layers, tunnel barrier layers, and free layers, as is conventional in the art. Finally a top electrode 16 is deposited on the MTJ layers 14.

Figure 2:
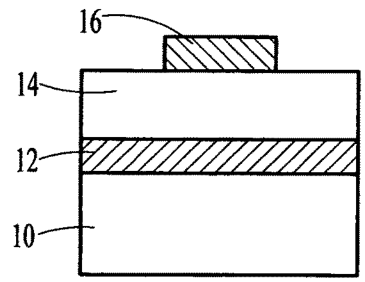

A photoresist mask 25 is formed over the top electrode. As shown in FIG. 2, the top electrode is patterned using the photoresist mask 25.

Figure 3A:
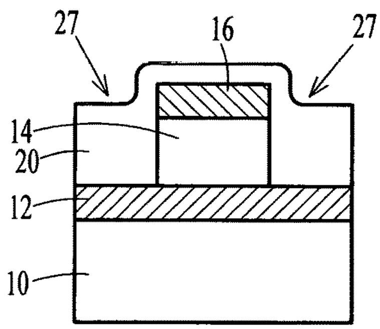

Now, an additional post treatment process is added in the middle of the etching process. After defining the top electrode 16 and before the main physical etching to define the MTJ area, preferably an oxidation treatment 27 is performed to oxidize the entire exposed MTJ area wherein the exposed MTJ area not covered by the patterned top electrode becomes oxidized 20 and therefore, non-conductive, as shown in FIG. 3A. That is, the entire stack not covered by the top electrode hard mask is oxidized, including the capping layer, free layer, pinned layer, seed layer and so on. This will ensure that all re-deposition after IBE etching will be still non-conductive to prevent any shutting path.

Oxidizing the re-deposited material after etching is undesirable because the oxygen might damage the MTJ device. It is hard to control the penetration depth of the oxide. Oxidizing prior to etching does not cause this problem because all of the oxygen will be gone after etching.

Figure 4A:
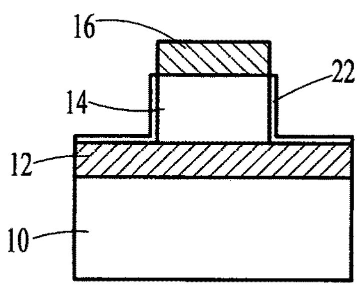

After the treatment process, a physical etching will be applied to define the MTJ area, as shown in FIG. 4A. The additional treatment will not eliminate sidewall re-deposition, but we can ensure the re-deposition material 22 will not be conductive and, thus, it will not lead to a shunting path cross the MTJ barrier. Most of the etched material should be pumped out during the etching process, but even if there is some re-deposition on the MTJ sidewall, it will not become a shutting path because it is not conductive.

Figure 3B:
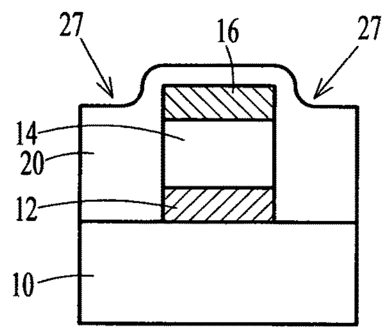
Figure 4B:
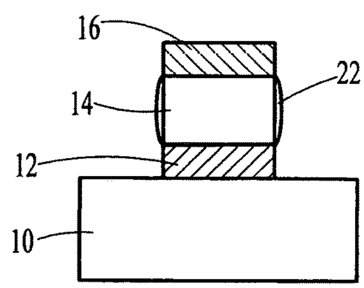

Depending on process integration, the bottom electrode could be patterned prior to depositing the MTJ layers. Or the bottom electrode could be patterned after patterning the MTJ device. We can eliminate the re-deposition shunting problem from the bottom electrode if we increase the oxidation power and/or time to oxidize the bottom electrode portion not covered by the top electrode hard mask before we perform the MTJ etching, as shown in FIG. 3B. Then, when we pattern the bottom electrode, any re-deposition 22 on horizontal surfaces of the bottom electrode layer are removed during this etching. Some re-deposition may occur on sidewalls of the MTJ stack, but this will be non-conductive material 22, as shown in FIG. 4B.

The post treatment can be applied in a variety of different ways. These can include: 1) Natural oxidation or nitridation by introducing oxygen or nitrogen gas, 2) Oxidation or nitridation with plasma assist or ion-beam assist, or 3) Treatment by a liquid such as water or a solvent. It might be necessary to apply the treatment multiple times to ensure all the metallic material in the MTJ stack is converted to oxide or nitride so that it becomes non-conductive.

In option 1, oxygen or nitrogen is introduced into a chamber containing the wafer prior to MTJ etching. If the MTJ stack is not very thick, the natural oxidation or nitridation might be enough to convert all of the MTJ stack not covered by the top electrode hard mask to a non-conductive material.

In option 2, plasma oxidation or nitridation might use pure $O_2$, pure $N_2$, or a mixture of $O_2$ and $N_2$. The plasma oxidation, nitridation, or mixed $O_2/N_2$ can optionally be performed with some noble gas such as Ar, Xe, and the like. $O_2$ or $N_2$ implantation could be performed to transform the material. Alternatively, $O_2$ or $N_2$ ion beam irradiation could perform oxidation or nitridation of the exposed layer.

In option 3, water or a solvent containing —OH or —NH, for example, could convert the exposed layers to oxides or nitrides.

Since the MTJ layers are oxidized or nitridized before performing the main physical etching, there should be no remaining oxygen or nitrogen gas in the area after MTJ etching is completed. This will mitigate oxygen or nitrogen damage to the MTJ sidewalls.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method for etching a magnetic tunneling junction (MTJ) structure comprising:

providing a stack of MTJ layers on a bottom electrode wherein metal is included in at least some of said MTJ layers;

providing a top electrode on said MTJ stack;

patterning said top electrode;

thereafter oxidizing or nitridizing entire said MTJ stack not covered by patterned said top electrode thereby converting to oxide or nitride all of said MTJ stack material not covered by said patterned top electrode; and thereafter etching said MTJ stack to form a MTJ device wherein any sidewall re-deposition formed on sidewalls of said MTJ device as a result of said etching step comes from oxidized or nitridized said MTJ stack material and is non-conductive.

2. The method according to claim 1 wherein said MTJ stack is patterned using a physical etching process.

3. The method according to claim 1 wherein said oxidizing or nitridizing is by exposing said MTJ stack to oxygen or nitrogen, respectively.

4. The method according to claim 1 wherein said oxidizing or nitridizing is by oxide or nitride plasma or ion-beam methods comprising pure $O_2$ or pure $N_2$ or $O_2$ or $N_2$ mixed with one or more noble gases.

5. The method according to claim 1 wherein said oxidizing or nitridizing is by applying water or a solvent containing oxygen or nitrogen.

6. The method according to claim 1 wherein said oxidizing or nitridizing step is not sufficient to oxidize or nitridize all of said MTJ stack not covered by patterned said top electrode and wherein said oxidizing or nitridizing step is repeated until all metal in said MTJ stack not covered by patterned said top electrode is converted to oxide or nitride.

7. The method according to claim 1 further comprising oxidizing or nitridizing said bottom electrode not covered by patterned said top electrode thereby converting to oxide or nitride all of said bottom electrode material not covered by said patterned top electrode.

8. A method for etching a magnetic tunneling junction (MTJ) structure comprising:

providing a stack of MTJ layers on a bottom electrode wherein metal is included in at least some of said MTJ layers;

providing a top electrode on said MTJ stack;

patterning said top electrode;

thereafter oxidizing or nitridizing entire said MTJ stack and said bottom electrode not covered by patterned said top electrode thereby converting to oxide or nitride all of said MTJ stack material and said bottom electrode material not covered by said patterned top electrode;

thereafter etching said MTJ stack to form a MTJ device wherein any sidewall re-deposition formed on sidewalls of said MTJ device as a result of said etching step comes from oxidized or nitridized said MTJ stack material and is non-conductive; and thereafter patterning said bottom electrode wherein any sidewall re-deposition on sidewalls of said MTJ device comes from oxidized or nitridized said bottom electrode material and is non-conductive.

9. The method according to claim 8 wherein said MTJ stack is patterned using a physical etching process.

10. The method according to claim 8 wherein said oxidizing or nitridizing is by exposing said MTJ stack to oxygen or nitrogen, respectively.

11. The method according to claim 8 wherein said oxidizing or nitridizing is by oxide or nitride plasma or ion-beam methods comprising pure $O_2$ or pure $N_2$ or $O_2$ or $N_2$ mixed with one or more noble gases.

12. The method according to claim 8 wherein said oxidizing or nitridizing is by applying water or a solvent containing oxygen or nitrogen.

13. The method according to claim 8 wherein said oxidizing or nitridizing step is not sufficient to oxidize or nitridize all of said MTJ stack not covered by patterned said top electrode and wherein said oxidizing or nitridizing step is repeated until all metal in said MTJ stack and said bottom electrode not covered by patterned said top electrode is converted to oxide or nitride.

* * * * *